US006903349B2

(12) United States Patent
Mitchell et al.

(10) Patent No.: US 6,903,349 B2
(45) Date of Patent: Jun. 7, 2005

(54) ION IMPLANTER AND A METHOD OF IMPLANTING IONS

(75) Inventors: Robert Mitchell, Pulborough (GB); John Gordon, Henfield (GB); Keith Relleen, Horsham (GB); Ronald F. Horner, Auburndale, MA (US); Theodore H. Smick, Essex, MA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 10/703,164

(22) Filed: Nov. 7, 2003

(65) Prior Publication Data

US 2004/0256578 A1 Dec. 23, 2004

(30) Foreign Application Priority Data

Nov. 5, 2003 (GB) ............................................ 0226261

(51) Int. Cl.[7] ............................................ H01J 37/317
(52) U.S. Cl. .............................. 250/492.21; 250/396 R
(58) Field of Search ........................ 250/492.21, 396 R; 315/500, 506

(56) References Cited

U.S. PATENT DOCUMENTS

| 4,667,111 | A | 5/1987 | Glavish et al. |
| 5,003,183 | A | 3/1991 | Nogami et al. |
| 5,301,488 | A | 4/1994 | Ruhl et al. |
| 5,389,793 | A | 2/1995 | Aitken et al. |
| 5,393,984 | A | 2/1995 | Glavish |
| 5,898,179 | A | 4/1999 | Smick et al. |
| 5,969,366 | A | 10/1999 | England et al. |
| 6,653,642 | B2 * | 11/2003 | Pedersen et al. ....... 250/492.21 |

FOREIGN PATENT DOCUMENTS

| GB | 2380601 | 9/2003 |
| JP | 6002588840 | 12/1985 |
| JP | 100204635 | 8/1998 |

OTHER PUBLICATIONS

A.D. Vlasov, *Theory of Linear Accelerators*, Chapter 2.5, published in English, translated 1968.
H.F. Glavish et al., "Production High Energy Implanters Using Radio Frequency Acceleration" in Nuclear Instruments and Methods in Physics Research, B21 (1987), pp. 264–269.

* cited by examiner

Primary Examiner—Kiet T. Nguyen
(74) Attorney, Agent, or Firm—Boult Wade Tennant

(57) ABSTRACT

An ion implanter incorporates an r.f. accelerator assembly to provide ions for implant at high energies. The accelerator assembly includes electrodes mounted in the vacuum chamber so as to be movable between an operational position for generating and accelerating electric field and a non operational position within the vacuum chamber displaced clear of the beam path. An Actuator moves the electrode between the operational and non operation positions. For energy implanting, the electrodes are in the operational position and for low energy implants the actuator moves the electrodes to the non operational position clear of the beam path.

21 Claims, 14 Drawing Sheets

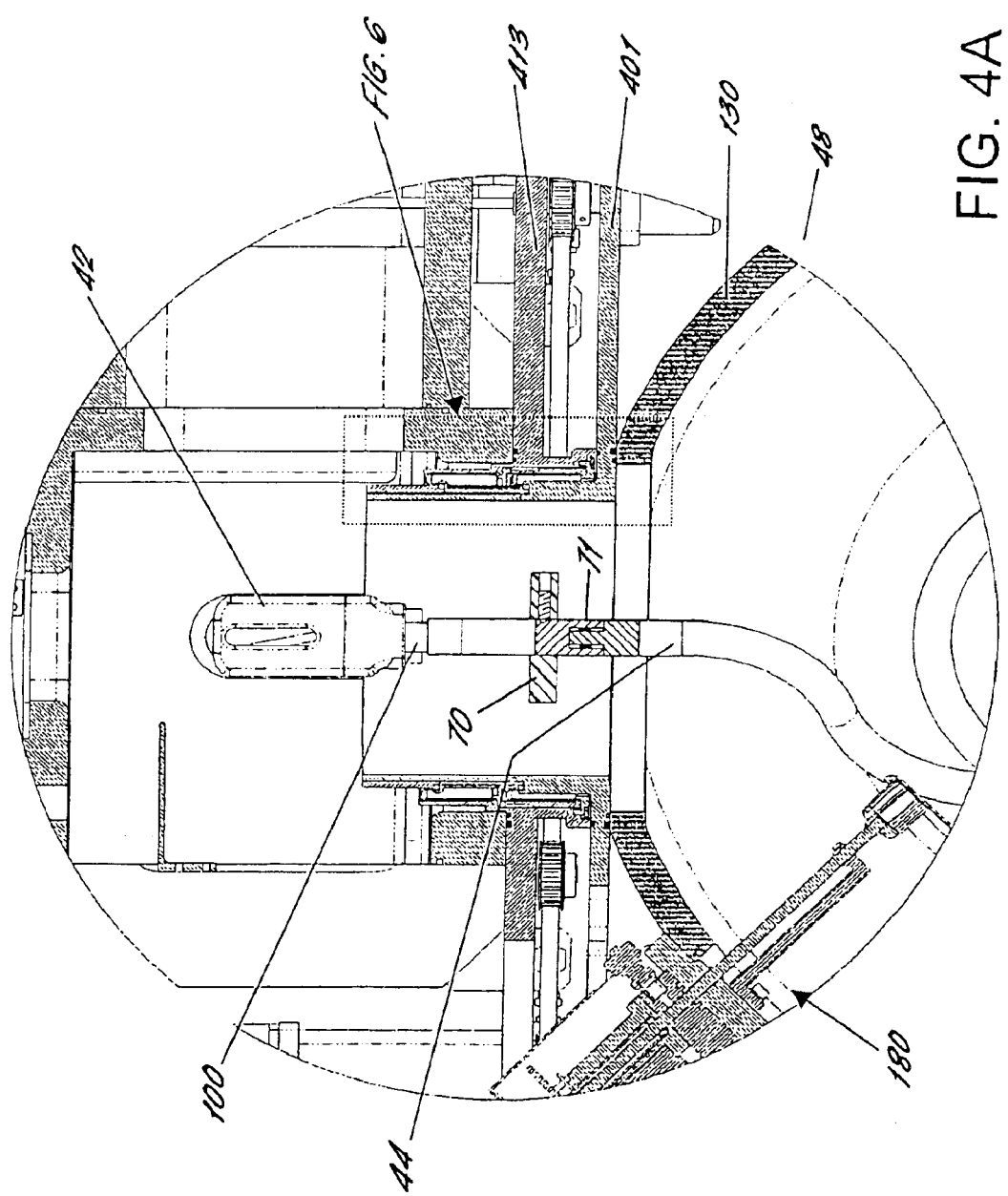

ION IMPLANTER AND A METHOD OF IMPLANTING IONS

FIELD OF THE INVENTION

The invention is concerned with ion implanters and with a method of ion implantation.

BACKGROUND OF THE INVENTION

Ion implanters have been used for many years in the processing of semiconductor wafers. Typically, a beam of ions of a required species is produced and directed at a wafer or other semiconductor substrate, so that ions become implanted under the surface of the wafer. Implantation is typically used for producing regions in the semiconductor wafer of altered conductivity state, by implanting, in the wafer, ions of a required dopant. Typical ionic species used for this purpose are boron, phosphorus, arsenic and antimony. However, other ionic species are also used for other purposes, including oxygen for example.

The depth to which implanted ions penetrate the surface of the wafer is largely dependent on the energy of the ions in the ion beam. The semiconductor industry requires both very shallow implants, for example for very fine structures having a small feature size, and relatively deep implants, for example for buried layers etc. It is also a general requirement of the semiconductor processing industry that process times should be as short as possible which implies that the quantity of ions being implanted per unit area and per unit time into a semiconductor wafer should be as high as possible. This implies that ion implantation is conducted with a high beam current, being a measure of the number of required ions in the beam reaching the wafer surface per unit time. There is also the requirement that implantation should be cost effective.

Beam energies up to about 200 keV (for singly charged ions) can quite readily be obtained using electrostatic acceleration systems, in which the source of ions is held at a fixed voltage relative to the wafer to be implanted, the fixed voltage defining the energy of the ions in the beam on implantation.

In most ion beam type ion implanters, a mass selection stage is required to select from the beam from the ion source those ionic species required for implantation. Typically mass selection is performed using a mass analysing sector magnet combined with a mass resolving slit downstream of the magnet. It is common practice in implanters using electrostatic acceleration systems for the full beam energy to be delivered to the ions of the beam prior to entering the mass analyser. However, post mass analysis electrostatic acceleration and deceleration are known, using additional electrostatically biased electrodes between the mass resolving slit and the substrate. Examples include U.S. Pat. No. 5,389,793 and U.S. Pat. No. 5,969,366.

For higher implant energies radio frequency acceleration systems have been employed, usually post mass analysis. Examples include U.S. Pat. No. 6,423,976 and U.S. Pat. No. 4,667,111 describing the use of r.f. linear accelerators, and U.S. Pat. No. 5,301,488 describing the use of r.f. quadrupole accelerator.

It is a known practice to operate ion implanters having post mass analysis accelerators (or decelerators), without energising the accelerators (or decelerators), in so-called drift mode. This practice allows the implanter to operate at lower energies (or higher for post decelerators), using the beam energy directly from the mass analyser. U.S. Pat. No. 6,423,976 describes drift mode operation of a r.f. linear type accelerator. However, the beam current available for implanting when operating in drift mode can be disappointing.

SUMMARY OF THE INVENTION

An object of the present invention is to provide an improved ion implanter which can be used for producing high energy ion beams as well as permitting efficient transport of significantly lower energy beams therethrough, so that the implanter in which an accelerator assembly is installed can be operated efficiently across a wide spectrum of ion implantation energies.

The present invention provides an ion implanter comprising an ion beam generator for generating a beam of ions to be implanted in which said ions are at a first energy, and an accelerator assembly having a vacuum chamber and operative when energised to accelerate ions of said beam to a second energy along a beam path through the vacuum chamber of the assembly, the assembly comprising at least one electrode mounted in the vacuum chamber to be movable between a respective operational position for generating an accelerating electric field to accelerate said ions along said beam path, and a respective non-operational position within the vacuum chamber displaced clear of said beam path, and an actuator to move said electrode between said operational and non-operational positions.

The accelerator assembly may be a radio frequency (r.f.) accelerator, for example a linear accelerator.

The accelerator assembly itself may comprise at least one r.f. booster stage comprising entrance and exit electrodes and at least one intermediate r.f. electrode. Preferably said electrodes of said booster stage are mounted to be movable together transversely of said beam path between respective said operational and non-operational positions.

Because the actuator can move the electrode or electrodes of the accelerator assembly out of the beam path through the vacuum chamber, drift mode operation (with no voltages applied to the accelerator) permits significantly increased beam current to be delivered to the substrate.

A typical accelerator assembly comprises at least first and second said r.f. booster stages in tandem along said beam path, said first booster stage being upstream of said second booster stage relative to said beam direction, and said electrodes of second booster stage being movable between respective said operational and non-operational positions independently of said electrodes of said first booster stage.

In this way, the implanter may be operated with only the first booster stage energised to accelerate beam ions, and with the second stage de-energised with its electrodes clear of the beam path. The resulting beam current can then be higher.

In a preferred ion implanter according to the present invention, said at least one intermediate r.f. electrode of the accelerator assembly is movable between said operational and non-operational positions, and the accelerator assembly includes at least one inductive coil electrically connected to said at least one intermediate r.f. electrode, and an electrically conductive enclosure around said coil; said coil, said at least one electrode and said conductive enclosure forming together a r.f. tank circuit having a predetermined resonant frequency when the at least one r.f. electrode is in said operational position; said coil being mounted to move with the at least one r.f. electrode. This conductive enclosure can be mounted to be movable with said coil and the at least one r.f. electrode.

BRIEF DESCRIPTION OF THE DRAWINGS

There now follows by way of example a detailed description of an ion implanter embodying the present invention.

In the accompanying drawings:

FIGS. 4A and 4B are enlarged cross-sectional axially oriented views corresponding to FIGS. 3A and 3B respectively, showing the disposition of the first r.f. electrode of the second stage of the assembly when raised and lowered respectively;

DESCRIPTION OF THE PREFERRED EMBODIMENTS

Aspects of the invention may be employed in many different kinds of ion implanters, including both implanters designed for simultaneously processing a batch of wafers, and single wafer implanters designed for processing single wafers one after the other.

Figure 1:
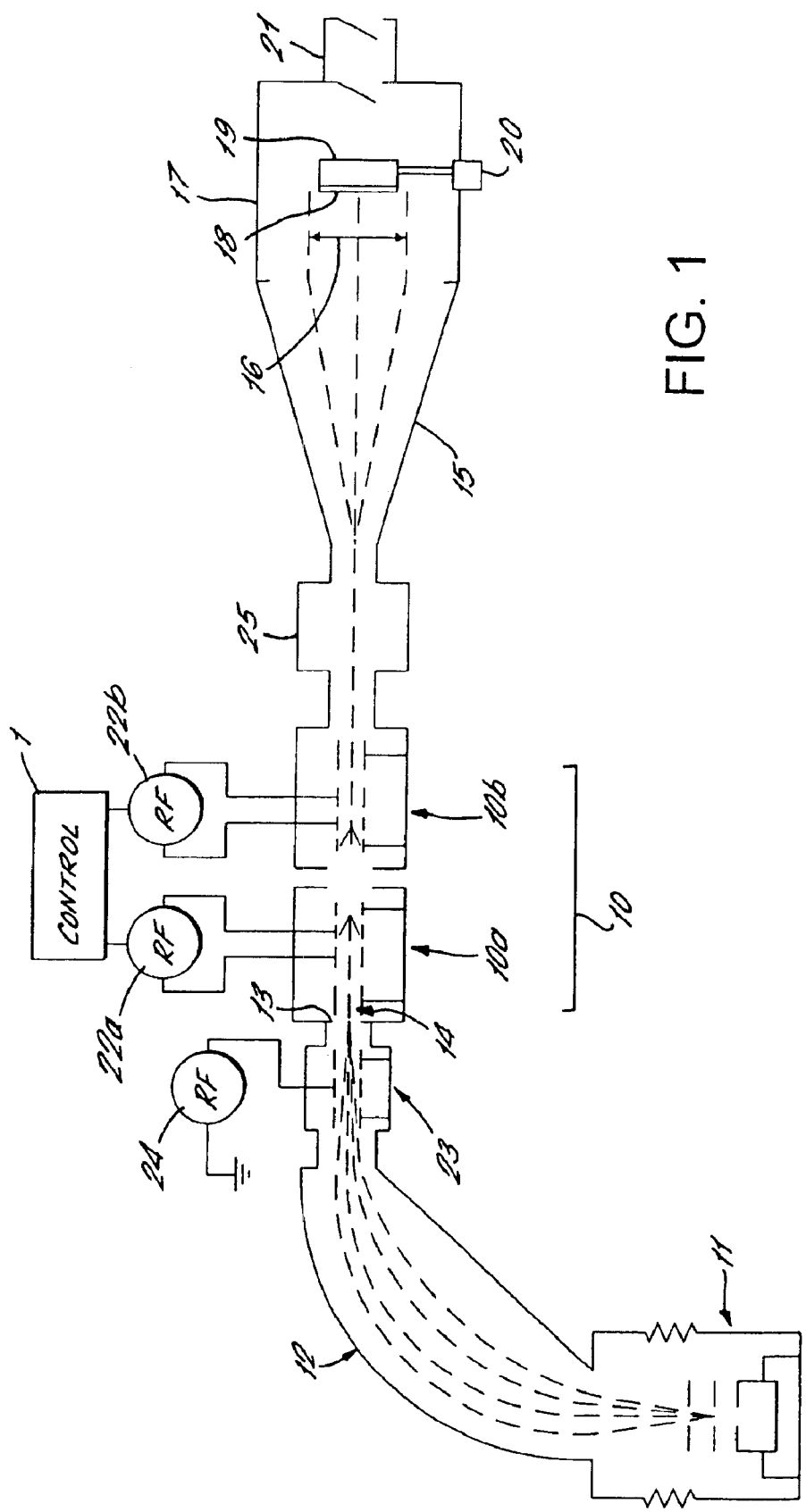
FIG. 1 is a general schematic plan view of an ion implanter which embodies the present invention.

FIG. 1 illustrates schematically a single wafer implanter incorporating a radio frequency (r.f.) linear accelerator assembly shown generally and schematically at 10. In the arrangement shown in the simplified diagram of FIG. 1, the general construction of an implanter is shown also to comprise an ion source 11 directing a beam of ions at a predetermined energy E into an analyser magnet 12. Only ions of the required velocity times mass/charge (m/e) ratio pass through a mass selection slit 13 at the exit of the analyser magnet 12, and enter as a beam 14, still at energy E, into the radio frequency accelerator assembly 10.

The beam exiting the r.f. accelerator assembly 10 then enters a beam scanning device 15 which is arranged to scan the ion beam to and fro in a direction 16 transverse to the beam direction. The scanning device 15 may be either electrostatic or electromagnetic. Electromagnetic scanning systems are preferred in applications especially for high current beams. A suitable electromagnetic scanning system is disclosed in U.S. Pat. No. 5,393,984.

The scanned beam then enters a process chamber 17 in which a semiconductor substrate 18 is held on a holder 19. The holder 19 is mounted on a mechanical scanning mechanism shown generally at 20 which can be actuated to reciprocate the wafer in a direction normal to the plane of the paper in FIG. 1 and across the plane of the scanned beam. The combination of scanning of the beam and mechanical scanning of the wafer holder 19 allows the beam to scan over all parts of the wafer during an implant process. Processed wafers are removed from the holder 19 and passed out of the process chamber 17, and fresh wafers for processing are brought into the chamber 17 and mounted on the holder 19 one at a time, via a load lock 21, and using robot handling mechanisms which are not shown in this drawing for simplicity.

Further details of single wafer implanters can be determined from U.S. Pat. Nos. 5,003,183 and 5,229,615, and of a preferred form of process chamber from U.S. Pat. No. 5,898,179. The specific details of the ion source, the mass selection magnet and the scanning and processing mechanisms of the implanter are not crucial to this embodiment of the present invention.

It should be understood that the invention is equally applicable to batch implanters, which typically rely solely on mechanical scanning to process a batch of semiconductor wafers simultaneously. The wafers are usually mounted around the periphery of a rotating wheel, which rotates to bring the wafers one by one across the line of the ion beam. Meanwhile, the axis of rotation of the wheel is reciprocated to and fro to complete the scanning in the orthogonal direction.

The earlier referenced U.S. Pat. No. 4,667,111 describes such a batch type implanter. Reference may also be made to U.S. Pat. No. 5,389,793 for further details of a typical batch type implanter.

Referring again to FIG. 1, the r.f. accelerator assembly 10 is schematically illustrated in the form of a two-stage accelerator assembly in which each stage 10a, 10b is a three-gap accelerator stage wherein an r.f. voltage of opposite polarity is applied from a respective source 22a, 22b to respective ones of the two centre electrodes of each stage. The two sources 22a, 22b are controlled from a control unit 1 so that the two sources are synchronised to accelerate ions through the assembly.

In the example illustrated, a buncher 23 is incorporated in front of the accelerator assembly 10 to form and deliver bunches of ions at the injection energy to the accelerator to increase the proportion of ions from the unbunched beam which may be accelerated by the accelerator assembly. Such bunchers are known, and generally produce a controlled energy spread in beam ions so that the ions become physically bunched on entry into the accelerator assembly. Known bunchers are designed to capture for bunching a maximum proportion of unbunched beam ions, without providing any overall increase in average energy to the bunched ions. In FIG. 1, the buncher 23 is illustrated as a two gap device having a central electrode energised from an r.f. supply 24. The purpose and operation of bunchers is described in "Theory of Linear Accelerators", by A. D. Vlasov, Chapter 2.5, published in English translation in 1968.

The r.f. accelerator assembly 10 is followed, along the beam direction, by an energy filter, illustrated generally in FIG. 1 at 25. The use of such an energy filter following an r.f. accelerator assembly in ion implanters is well known, see for example "Production of High Energy Ion Implanters Using Radio Frequency Acceleration" by Glavish et al, Nuclear Instruments and Methods in Physics Research, B21(1987) 264–269. The energy filter is used to limit the range of energies of ions from the accelerator which proceed to be implanted in the semiconductor substrate.

The energy filter may take any known form such as an electrostatic inflector or an analyser magnet.

Figure 2A:
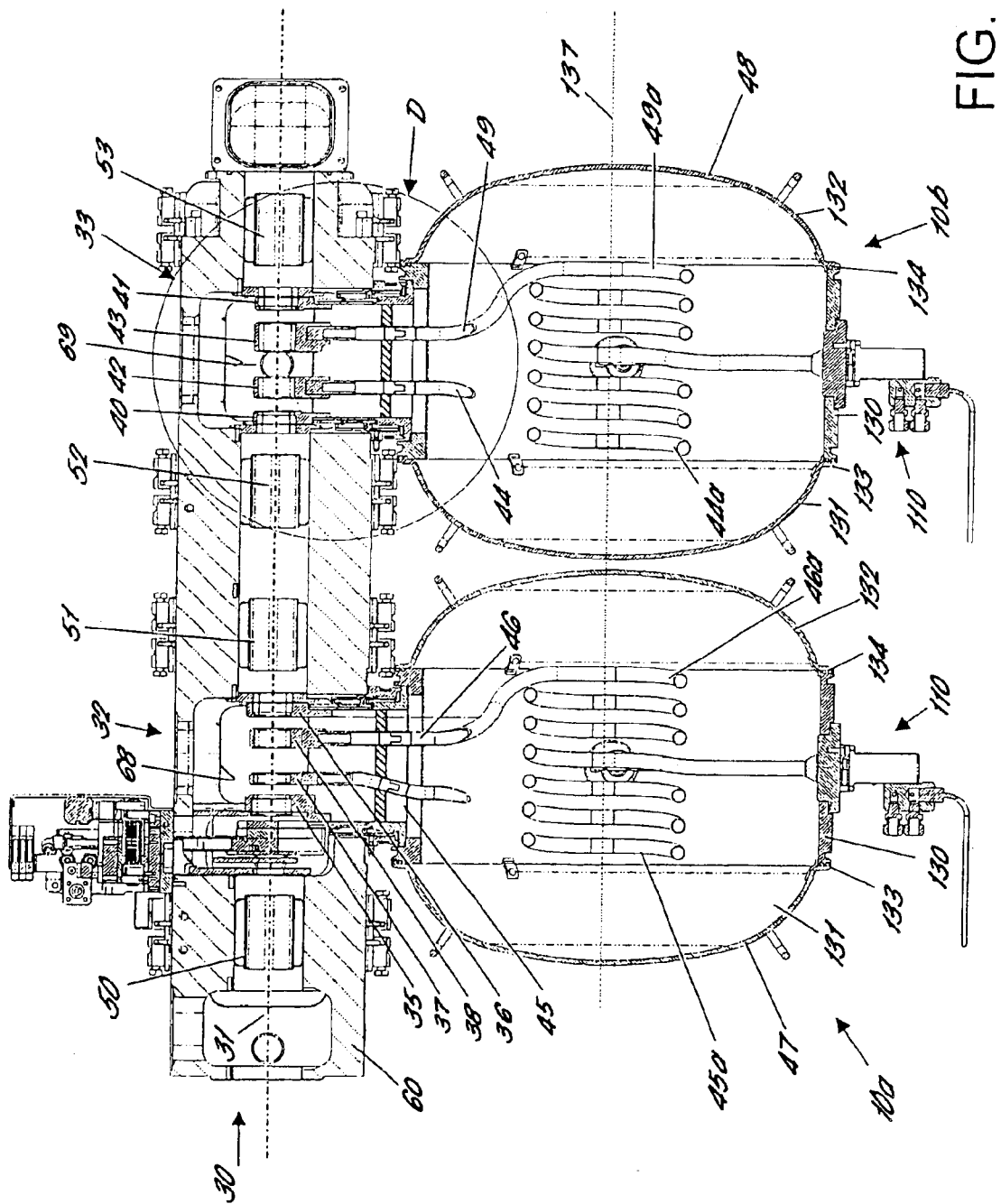
FIGS. 2A and 2B are side sectional views of an r.f. accelerator assembly embodying the present invention showing first and second stages thereof with electrodes thereof raised and lowered respectively.
Figure 2B:
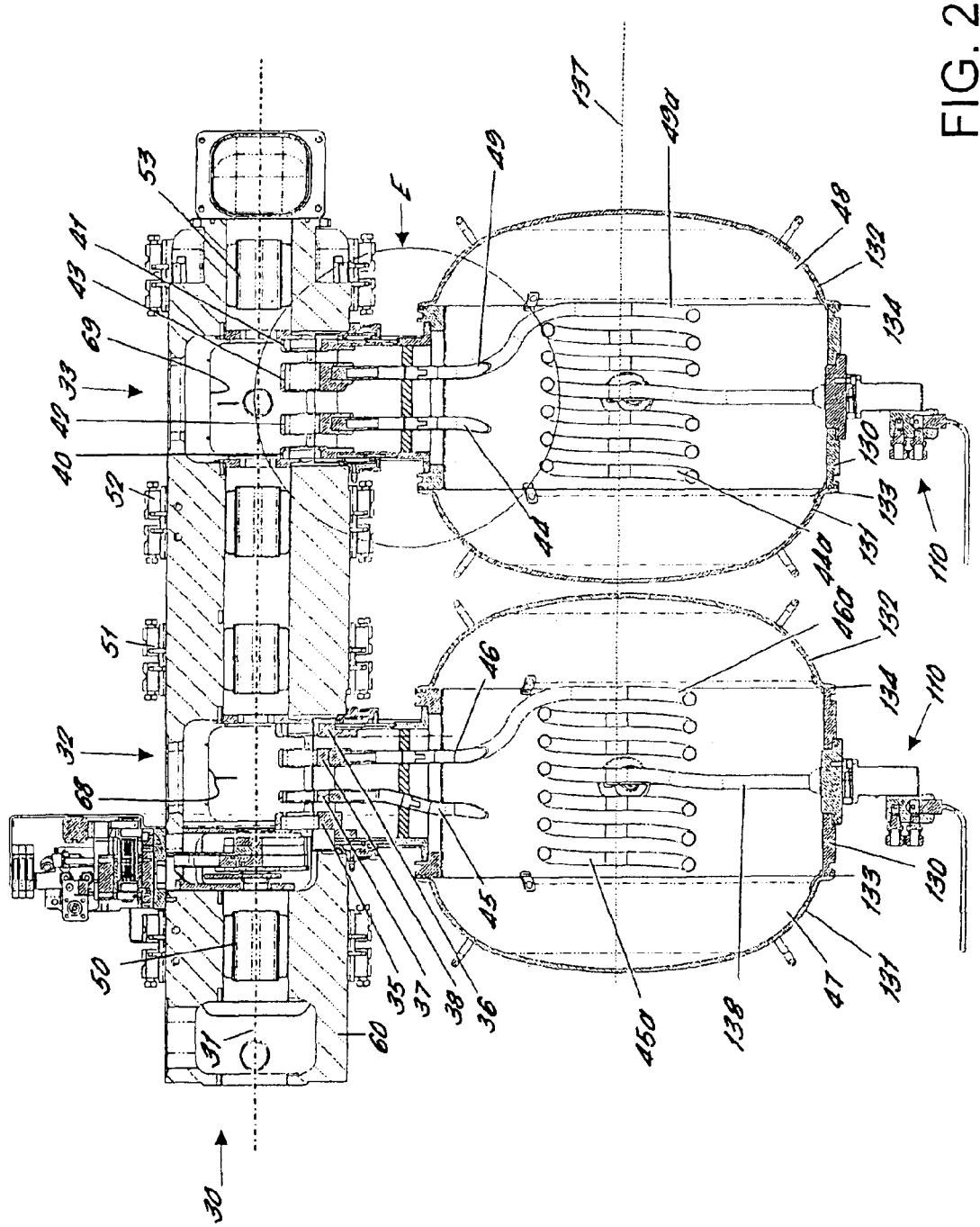

Referring now to FIGS. 2A and 2B, many components of the accelerator assembly illustrated are the same as described in U.S. Pat. No. 6,423,976. The ion beam from the analyser magnet enters the accelerator assembly from the left in the direction of arrow 30 and passes through the accelerator assembly generally along the line of an axis 31.

The accelerator assembly is, as previously mentioned, formed by two, i.e. first and second, accelerator stages 10$a$ and 10$b$, also known as booster stages, each in the form of two three gap r.f. booster cavities in tandem and illustrated generally at 32 and 33. It will be clearly understood by those conversant with the art, that an accelerator may be constructed with only a single accelerator stage or more than two, depending upon requirements.

FIGS. 2A, 2B are generally side sectional views of the accelerator assembly, parts of the outer walls of the vacuum chamber of that assembly having been broken away showing the location of the electrodes of the two acceleration stages represented by the cavities 32 and 33. In FIGS. 2A, 2B, inspection hatches 68, 69 which are provided for gaining access to electrodes within the assembly have also been shown with cover plates removed to show the positions of the electrodes. These electrodes and the general construction of the two acceleration stages are shown in section in FIGS. 2A and 2B initially and in greater detail in the ensuing Figures.

The booster cavity 32 has an entrance electrode 35 and an exit electrode 36 and the cavity 33 has entrance electrode 40 and exit electrode 41.

These entrance and exit electrodes 35, 36 are held at the same constant potential, usually ground potential. Between the electrodes 35 and 36 are the first and second r.f. electrodes 37 and 38 of the first stage of the accelerator assembly, and, between entrance and exit electrodes 40, 41, the first and second r.f. electrodes 42, 43 of the second stage.

The r.f. electrodes 37 and 38 of the first stage 10$a$ are mounted to be electrically insulated from the walls of the vacuum chamber, and it can be seen that the four electrodes 35 to 38 between them define three successive gaps along the beam direction 30. As will become apparent, each of the electrodes 35 to 38 defines an aperture on the axis 31 through which the beam can pass. Generally speaking, the axis 31 can also be considered as the centre line of the ion beam as it passes through the accelerator assembly. As will also be explained later herein, as the beam travels across the gaps between the electrodes when the accelerator stage is operating and these electrodes are energised, ions in the beam are accelerated by an r.f. field in the gaps produced by r.f. voltages applied to the first and second electrodes 37 and 38.

Figure 3A:
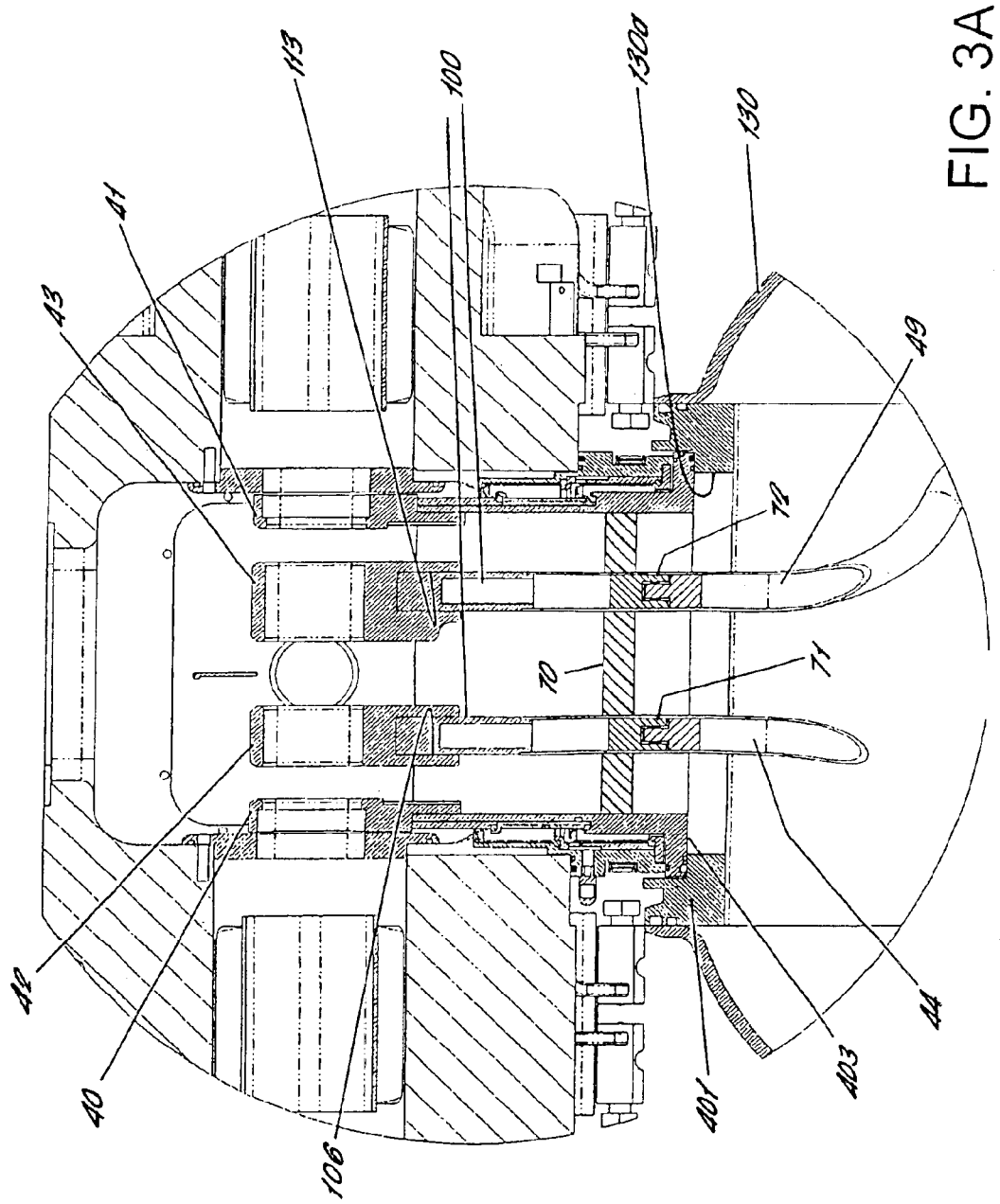
FIGS. 3A and 3B are sectional views showing greater detail of the encircled portions D and E of FIGS. 2A and 2B respectively, of the electrodes of the second stage of the accelerator assembly and of parts of the actuator of the accelerator assembly for moving the electrodes thereof.
Figure 3B:
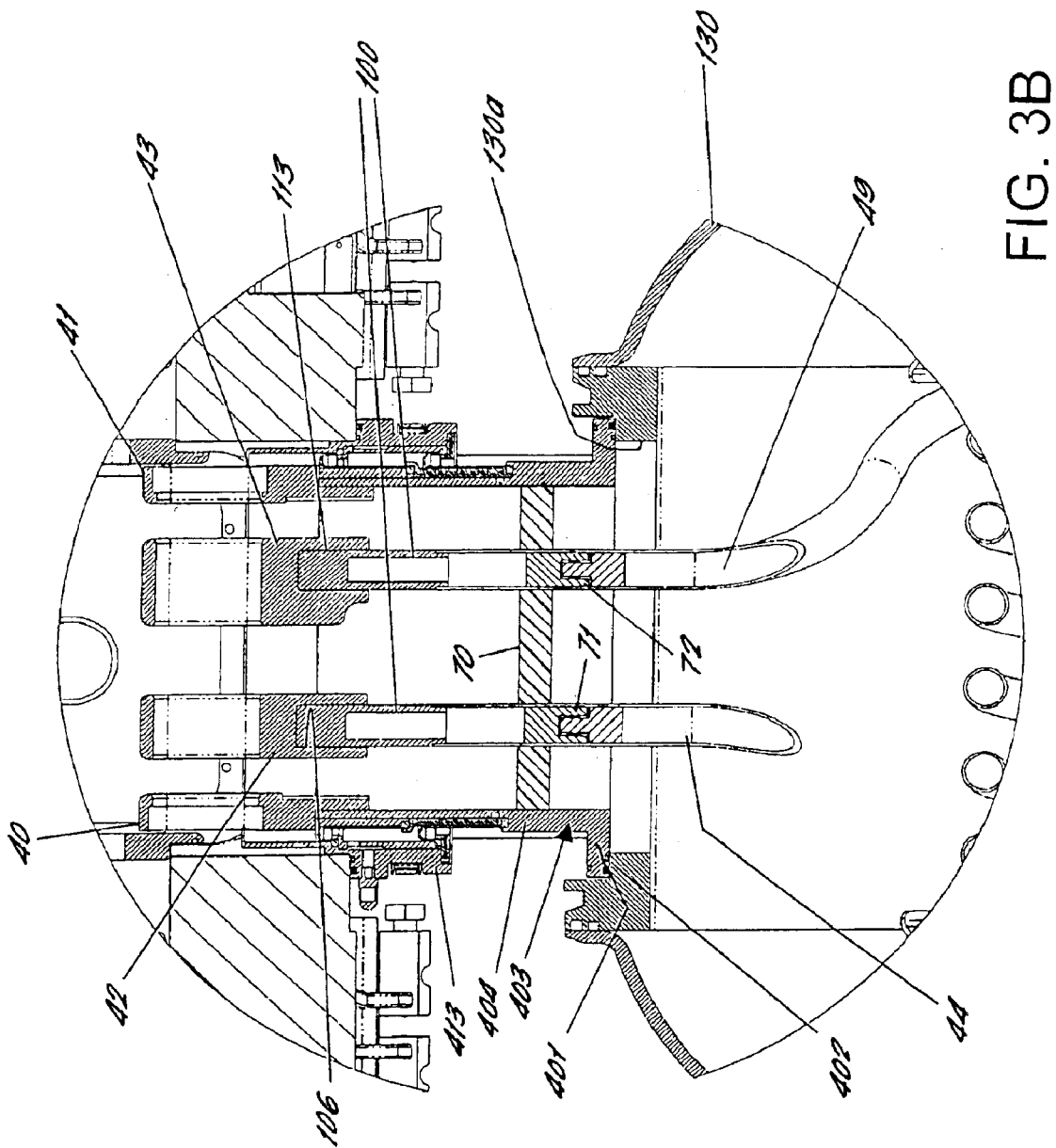
Figure 4B:
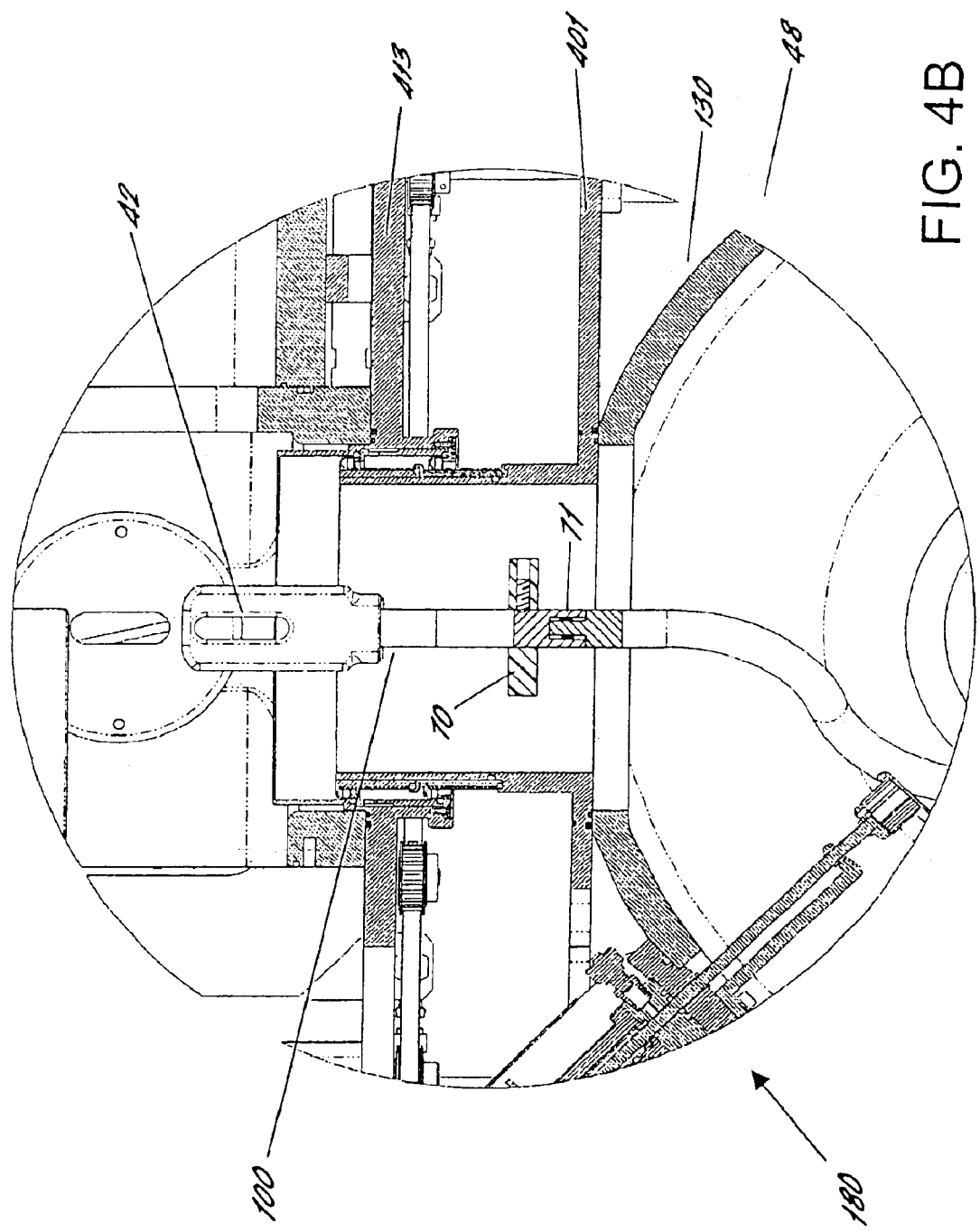
Figure 5:
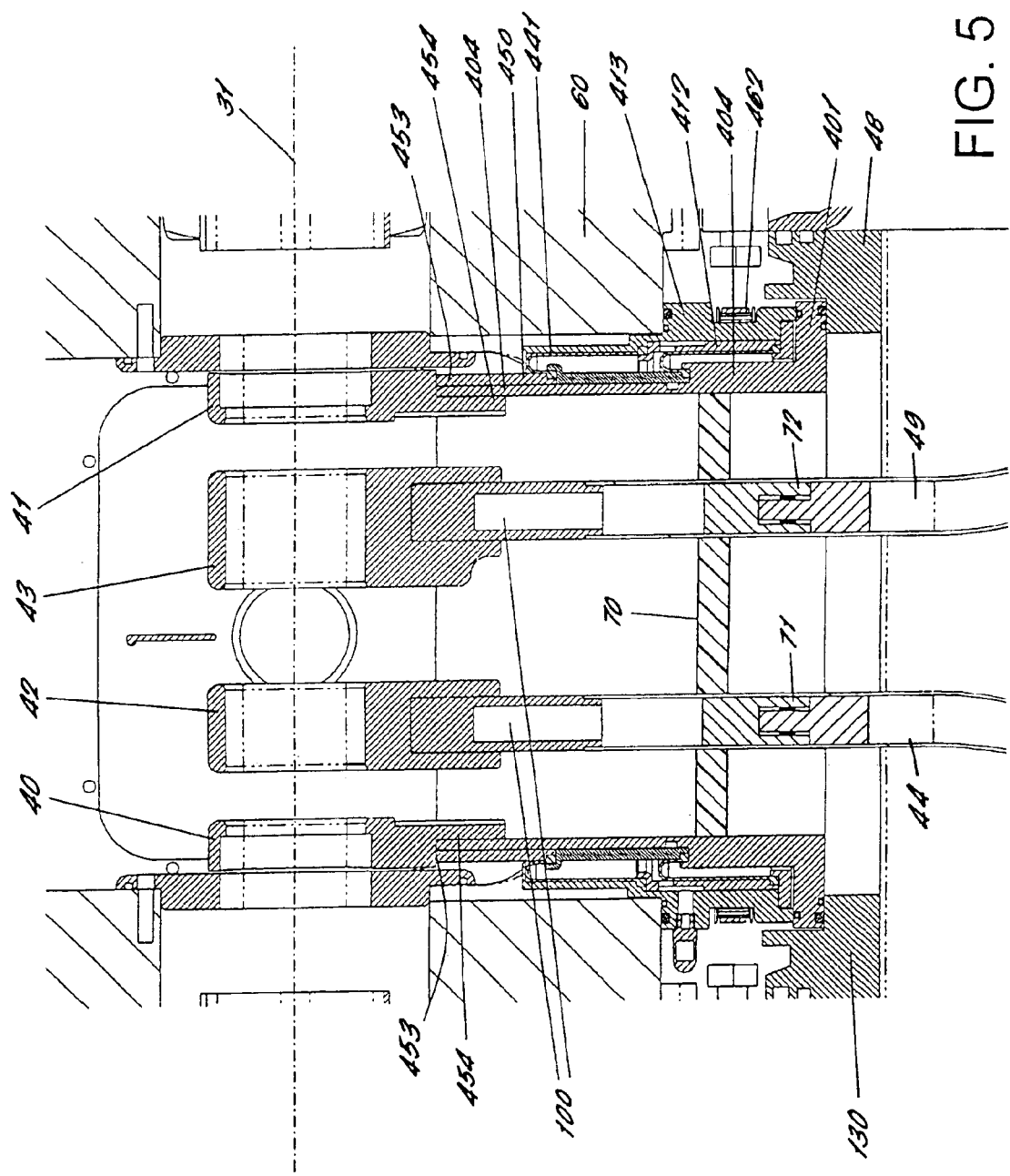
FIG. 5 is an enlarged sectional view, corresponding to FIG. 3A, of part of the actuator of the illustrated accelerator assembly according to the invention for raising and lowering electrodes of a stage of the assembly into and from the beam path through the assembly, but showing the electrodes in their raised positions.

In the embodiment of the present invention as illustrated in FIGS. 2A, 2B, the electrodes 35, 37, 38, 36 of the first stage of the illustrated assembly are mounted so as to be movable in order to move them from alignment with the beam path generally along the axis 31, as shown in FIGS. 2A, 3A, 4A, to a position in which they are clear of the beam path, as shown in FIGS. 2B, 3B, 4B. Though hereinafter described in detail, it will be clearly visible from comparison of FIG. 2A with FIG. 2B for example that, in FIG. 2A, the apertures in the electrodes 35, 37, 38 and 36 are all in line with the axis 31 whereas, from FIG. 2B, it can be seen that all the electrodes have been lowered, so that all of the electrodes are clear of the axis 31 and of the beam path, together with other elements of the assembly, as described below.

The second accelerator stage 10$b$ of the accelerator assembly shown in the Figures has a similar construction to the first stage 10$a$, with the entrance and exit electrodes 40 (shown specifically in FIGS. 2A, 2B) and 41 and intermediate r.f. electrodes 42 and 43, defining between them three accelerating gaps along the beam direction 30. The accelerator stages 10$a$ and 10$b$ lie in juxtaposed tandem relationship and the electrodes of both stages and their associated supporting structure, described below, are aligned.

The structure associated with each of the electrodes 37 and 38 of the accelerator stage 10$a$ of the assembly shown in the Figures, for mounting the r.f. electrodes, comprises a respective conductor 45, 46 which leads out of the chamber enclosing the ion beam and into a resonant tank chamber 47. Inside the tank chamber 47, the conductors 45 and 46 are formed as coils 45$a$, 46$a$ and are connected to ground. The combination of the electrodes 37 and 38, the coils 45$a$, 46$a$ in the tank chamber 47, the grounded metal components of the vacuum chamber surrounding the electrodes 37, 38 and the tank chamber 47 itself, which is also connected to ground, forms a resonant tank circuit which is designed to be resonant at a desired operating frequency of the accelerator, typically in the range 10 to 50 MHZ; preferably the operating frequency is about 20 MHZ.

The interior of the resonant tank chamber 47 is open to the interior of the vacuum chamber containing the electrodes 37 and 38, so that the interior of the tank chamber 47 is also at a vacuum.

The electrodes 42 and 43 of the second accelerator stage 33 of the accelerator assembly are also shown in FIGS. 2A, 2B and are similarly connected by conductors 44, 49 to coils 44$a$, 49$a$ within a similar resonant tank chamber 48 to chamber 47. The tank circuit formed by the chamber 48, the electrodes 42 and 43, conductors 44, 49 and coils 44$a$, 49$a$, is similarly arranged to have the same resonant frequency as the resonant cavity 32 of the first stage.

In operation of the assembly, r.f. power is supplied to the resonant circuits formed by the booster cavities of the two stages 32 and 33 with associated tank chambers 47 and 48, so that the r.f. electrodes 37, 38 and 42, 43 are energised with opposite polarity at the resonant frequency. Bunches of ions from the ion beam along the axis 31 are then accelerated as they traverse the gaps between the electrodes in the two resonant cavities so as to emerge from the accelerator assembly with increased energy.

FIGS. 2A, 2B also illustrate the location of magnetic quadrupoles along the beam axis 31 at 50, 51, 52 and 53 in each of the two stages. Magnetic quadrupoles are used to control expansion of an ion beam and bring the beam back to a required focus or waist as it traverses the accelerator assembly. The magnetic quadrupoles 50 to 53 are used to control the expansion of the beam as it passes through the r.f. accelerator assembly.

The r.f. accelerator assembly may be constructed using a unitary block of metal as illustrated generally at 60 in FIGS.

2A, 2B. The block 60 provides a housing (not shown) of the r.f. accelerator assembly whose interior is maintained under vacuum.

FIGS. 3A, 3B, 4A, 4B and 5 illustrate the construction of, and the mounting supports for the electrodes 40, 41, 42 and 43 of the second accelerator cavity 33 of the assembly of FIGS. 2A, 2B. The arrangement of the electrodes 35, 36, 37 and 38 of the first cavity 32 is similar, except that the electrodes of the second cavity are longer in the direction of the axis 31 to allow for increase in the velocity of the ions in the beam. Each of the r.f electrodes 42 and 43 of the cavity 33 is mounted on a respective metal shaft 100, typically of copper. The shafts 100 are themselves mounted within a rigid throat structure 403 which is rigidly connected to and movable with the main body 130 of the tank chamber. Thus, each of mounting shafts 100 is securely held in an insulator 70 which is itself rigidly connected across the opening defined by the throat structure 403, as best seen in FIGS. 3A and 3B. The insulator 70 holds the electrodes 42 and 43 rigidly aligned with the entrance and exit electrodes 40 and 41, within the throat structure 403.

The conductors 44 and 49 leading to the coils 44A and 49A within the tank chamber are connected to ends of the shafts 100 below the insulating member 70 by means of sliding fit connections 71 and 72 as illustrated. Each sliding fit connection incorporates a respective compressable annular interconnecting piece to ensure ohmic connection between the conductors 44,49 and the respective shafts 100 at the applicable r.f. frequencies. As can be seen in FIGS. 4A and 4B, the insulating member 70 comprises a bar, e.g. of appropriate ceramic material, extending across the aperture of the throat structure 403, generally in a direction parallel to the axis 31 of the accelerator assembly. The bar 70 provides openings on either side as illustrated in FIGS. 4A and 4B, so that the interior of the tank chamber 130 is in free communication with the interior of the accelerator assembly.

The form and structure of the electrodes is (except as discussed above), generally the same as disclosed in U.S. Pat. No. 6,423,976.

The electrodes of the assembly disclosed in U.S. Pat. No. 6,423,976 are fixed in position, so that the apertures therethrough are permanently aligned with the beam path 31. While this construction is completely satisfactory for producing an ion beam comprising high energy ions accelerated through the accelerator assembly, it is less suitable for lower energy ion beams which have to drift through the assembly when the electrodes are not energised. In this drift mode it is difficult to obtain the higher beam currents for implantation which are desirable.

In consequence, it has been appreciated by the inventors that it is necessary to address this issue if, indeed, an ion implanter comprising an accelerator assembly of the type with which this invention is concerned, i.e. a linear r.f. accelerator assembly, is to be truly multi-functional and be useful across a wide range of energies of ion implantation. The alternative to provision of a truly multi-functional instrument is to provide separate implanters, one for high energy ions and another for lower energy ions. Provision of separate implanters, however, is exceedingly costly.

In the above description, reference has only been made to mounting of the r.f. electrodes 37, 38, 42, 43. However, the entrance and exit electrodes 35, 36, 40 and 41 are also mounted for movement with the r.f. electrodes, as will be apparent in the following description of the actuator for moving the electrodes. The arrangement for permitting movement of the electrodes, and indeed the entire tank circuit of each stage of the accelerator assembly, is shown in FIG. 3A onwards.

Turning then to FIGS. 3 to 9, the arrangement for permitting movement of the electrodes 42, 43 is required to permit maintenance of the rigidity of structure of the resonant tank and the coils within it and of the relationship to the electrodes. Thus, the means or arrangement permitting that movement must permit movement of the resonant tank together with the coils and the electrodes as a single rigid unit. In the ensuing description, it is to be understood that the construction and arrangement for the electrodes 37, 38 of the first accelerator assembly 32 is substantially the same as that described for the electrodes of the second assembly 33.

The tank chamber 130 has an opening 130a in its uppermost section at which the tank chamber is secured to a platform 401 to form a vacuum seal therewith. The perimeter of the opening 130a is of L-shaped section to provide an internal shoulder 402 (FIG. 3B) to make a vacuum tight seal with the platform 401. The platform 401 carries the rigid throat structure 403 which may be of circular cross section when viewed in plan. The structure 403 provides an annular sleeve portion 404 (FIG. 3B), and is suspended beneath the accelerator block 60 in the manner and for the purpose hereinafter described.

The sleeve portion 404 has a uniform internal cross-section but its external surface is stepped at 405 (shown in FIG. 6) and provides a shallow channel 406 which is intended to receive a ribbed edge 407 of a differentially pumped sliding seal in the form of an annular skirt 408 which extends entirely around the sleeve 404. The ribbed edge 407 is located in the channel 406 and clamped in position by an exterior sheath 409 which forms a tight sliding fit on the exterior of the sleeve 404 and is, at its lower edge, provided with an exterior rebate 410. The thickness of the sheath 409 and the dimensions of the rebate 410 are such that the ribbed edge 407 can be trapped in the rebate with the material of the skirt 408 tightly wedged and so trapped between the sheath 409 and the interior surface of the channel 406 to provide a seal. The material of the skirt is impermeable to the passage of gas therethrough.

The opposite end of the skirt 408 is similarly formed to provide an annular ribbed edge 411 trapped in an annular collar 412 which is arranged to envelop the sleeve 404 and the skirt 408 and permit movement thereof.

A rectangular frame member 413 is secured to and mounted beneath the block 60. As can be seen from the plan view of the frame member 413 shown in FIG. 9, the frame member is rectangular in shape having a cutout 413a formed therein at one end. (The platform 401 is of substantially similar dimensions to the frame member when viewed in plan.)

A fixed collet portion 414 (FIG. 6) of the frame member 413 defines an aperture in the frame member 413 and extends through the wall of the block 60. The block 60 is in sealed vacuum tight engagement with the frame member 413.

The collet portion 414 has a downwardly extending flange portion 415 which, when each tank chamber is raised so that the electrode apertures are aligned with the beam path, has a lower annular face 416 that abuts against the upper surface of the platform 404 to thereby define the upper limit of movement of the tank chamber and the electrodes.

The collet portion 414 is formed with a first annular body portion 417 which at its lower end provides the flange portion 415, the flange portion 415 extending around an annular recess 418 formed in the lower end face of the body portion 417 and whose purpose is described below.

Around a waist portion of the first annular body portion 417 is formed an annular recess 420, whose function will also be described below.

Internally of the body portion 417 is the annular collar 412 which has a sealing sleeve 419 thereon which forms a vacuum tight sliding fit within the body portion 417. The collar 412 has an annular shoulder 422 formed internally at its lower end portion and, at its opposite, upper, end portion, which is of reduced internal diameter relative to the main part of the body portion 417, provides an upper end face 424.

The upper end face 424 abuts against an annular surface 423 provided by a first internal annular overhang 426 formed at the top end of the body portion 417, and with a second internal annular overhang 427 defines an undercut annular channel 428, whose purpose will be described shortly.

The collar 412 is held in position, when the arrangement is assembled, by an annular clamping ring 429 which seats in the annular recess 418 and is fastened to the body portion 417 by bolts 430. The clamping ring 429 has an annular neck portion 432 which, with the shoulder 422 of the collar 412, defines an undercut channel 433 within which the second, ribbed, edge 411 of the differential pressure seal can be secured.

Figure 6:
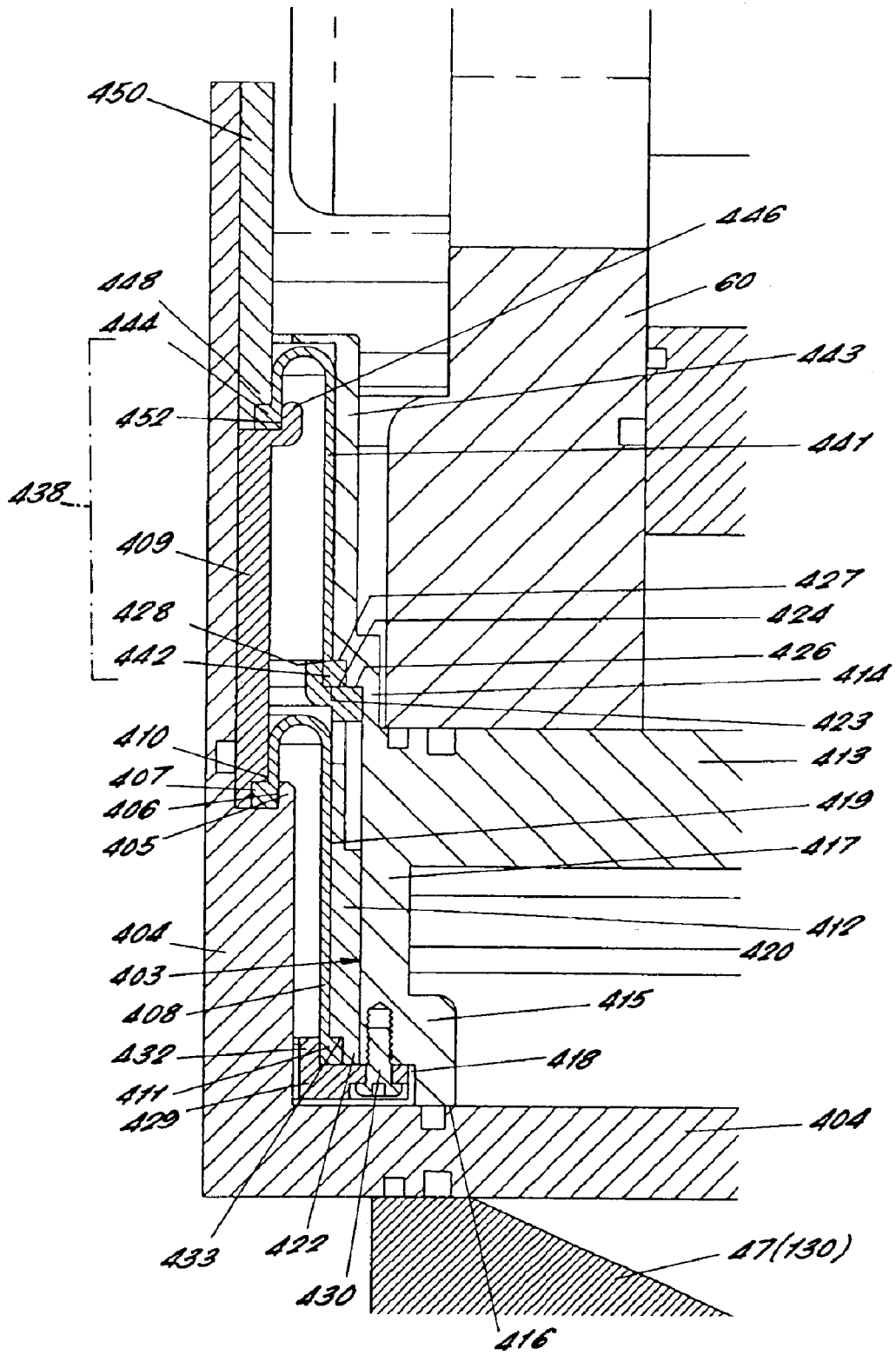
FIG. 6 is a still closer cross-sectional view, similar to FIG. 4A, but showing more detail, of the electrodes, and part of the actuator for raising and lowering them, in raised position.
Figure 7A:
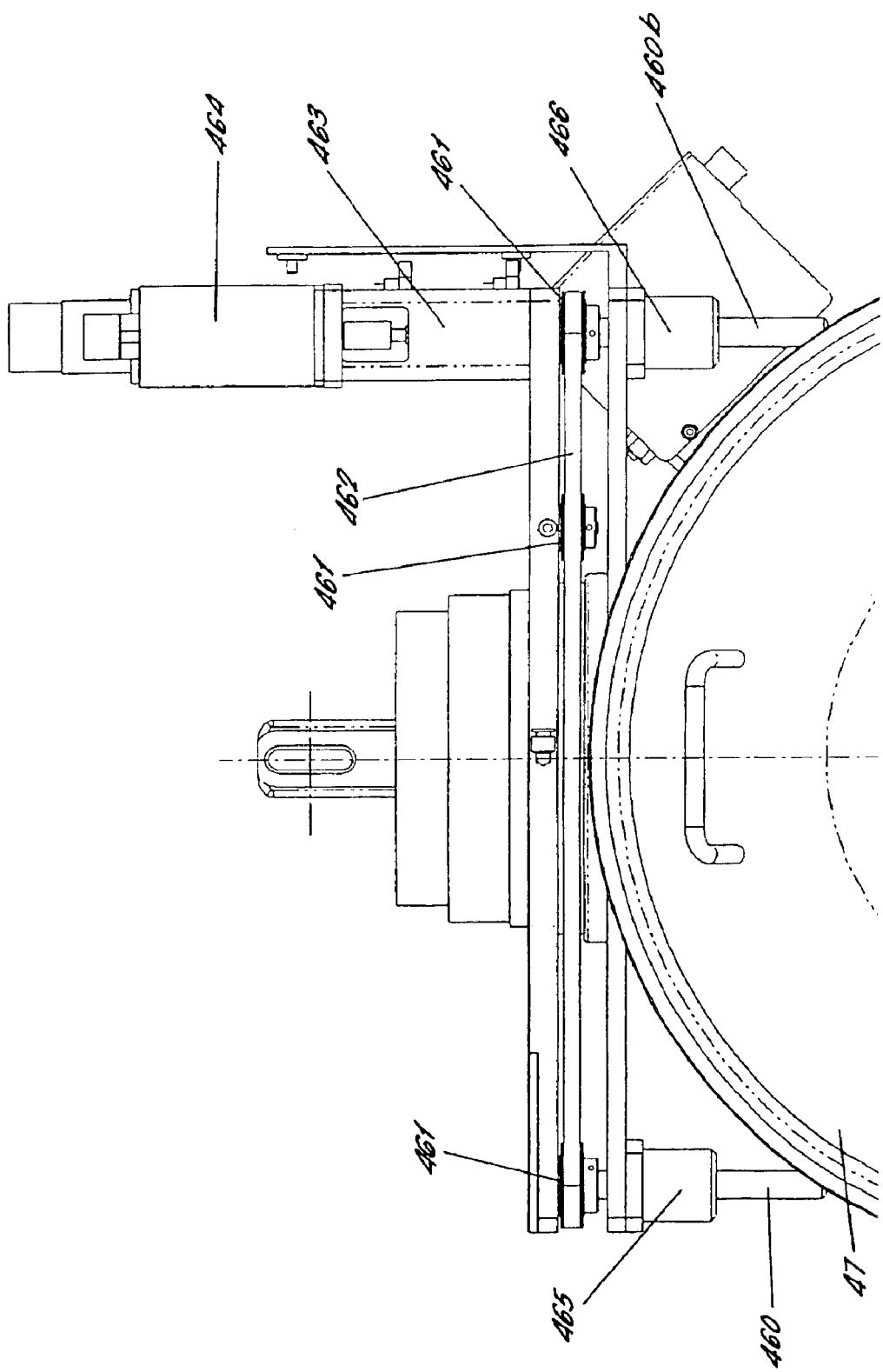
FIGS. 7A and 7B are end views of a mechanism of the actuator of an accelerator assembly according to the present invention for raising and lowering the electrodes into and from the beam path of the accelerator assembly, with FIG. 7 showing the electrodes in raised position and FIG. 8 showing them in lowered position.
Figure 7B:
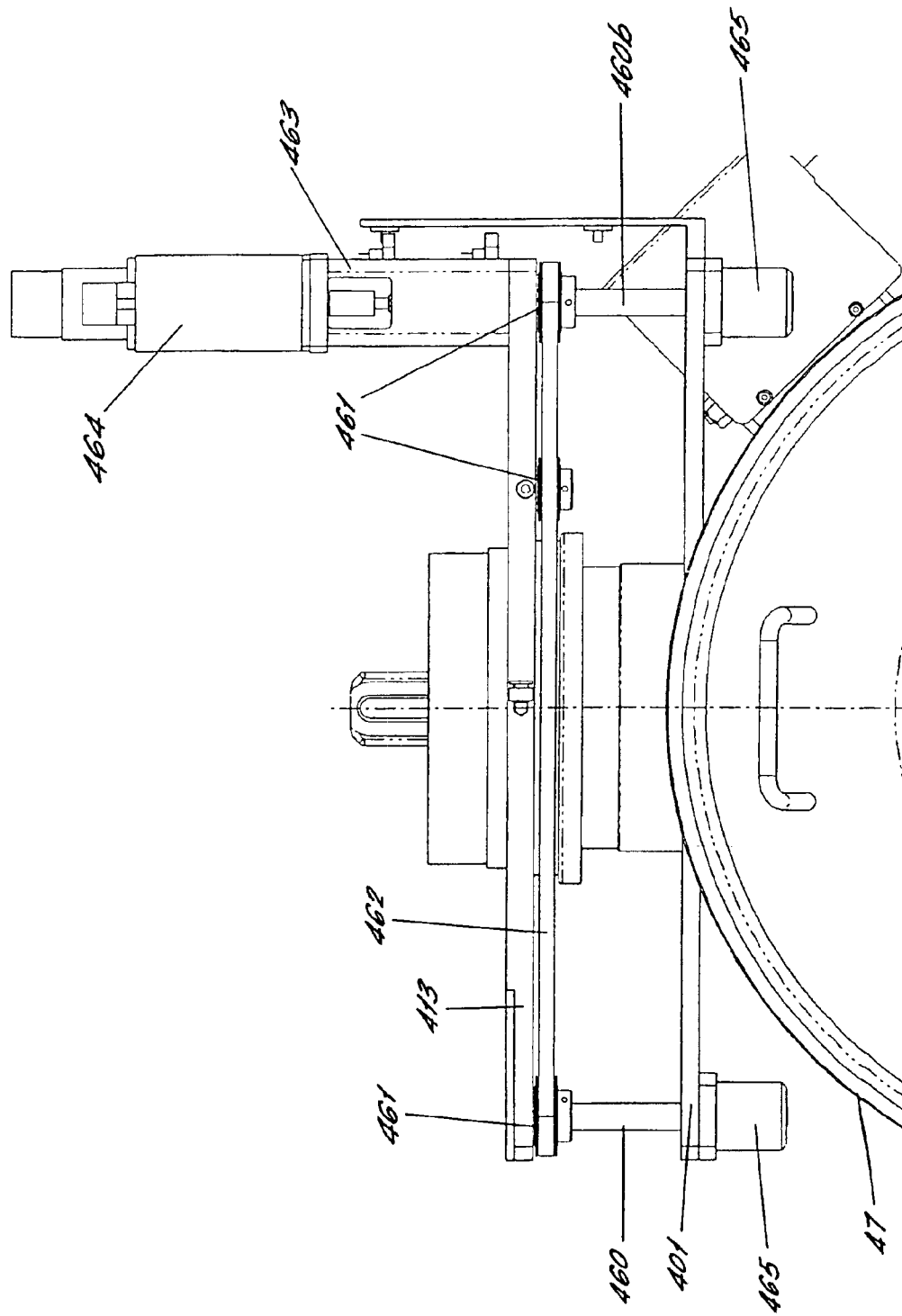
Figure 8A:
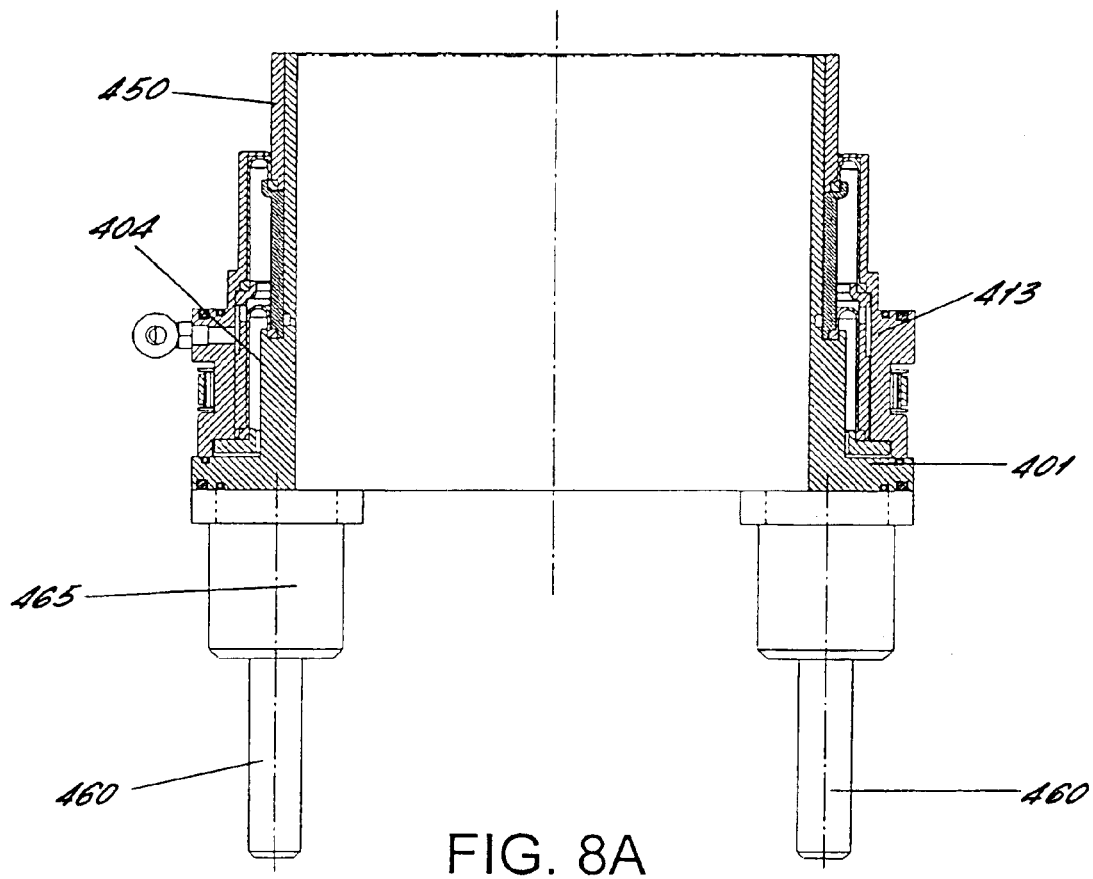
FIGS. 8A and 8B are side sectional views of parts of the mechanism for raising and lowering part of the actuator therefor shown in FIGS. 5 to 7.
Figure 8B:
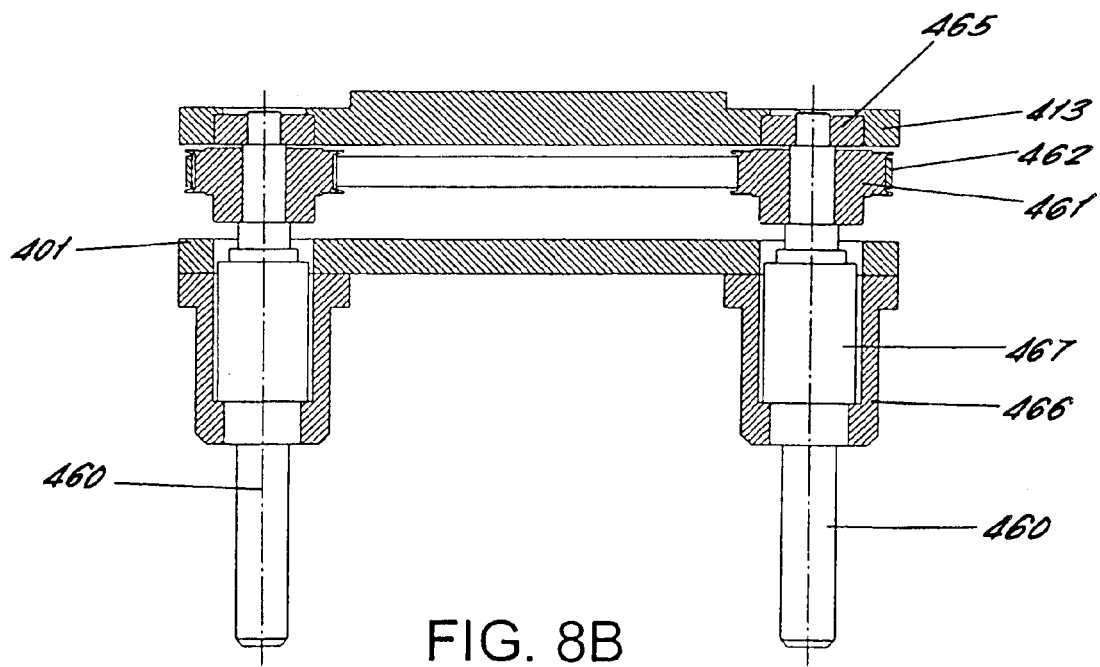
Figure 9:
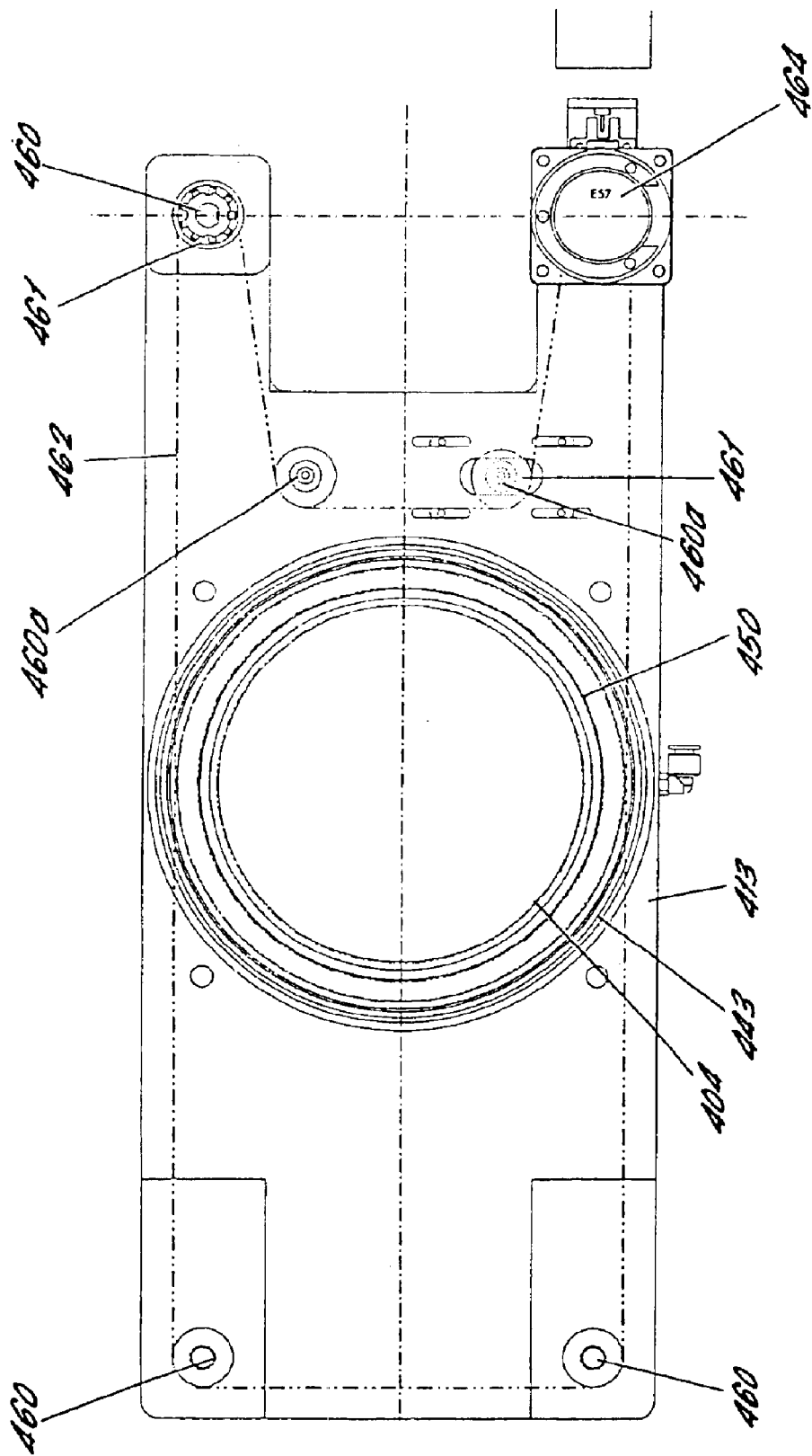
FIG. 9 is a plan view of a frame member of the actuator for raising and lowering the electrodes.

As is visible in each of FIGS. 2A, 3A, 4A and 5 but which can be best seen from FIG. 6, an annular gap exists between the collar 412 and the external surface of the annular sleeve portion 404 to permit movement of the skirt 408 when the sleeve portion 404 moves within the liner 421. The seal provided by the skirt 408 is entrained by its upper and lower annular ribbed edge portions 407 and 411 with one edge portion 407 sealingly secured in and to the slidable sleeve 404 and the other ribbed edge portion 411 sealingly secured to the fixed part of the arrangement and thus to the fixed structure of the block 60 of the linear accelerator assembly. As the tank chamber structure, comprising the tank chamber 48, electrodes 44, 49 and coils 44a, 49a, is raised or lowered, as hereinafter described, the ribbed edge portion 407 of the seal is also raised and lowered relative to the opposite ribbed edge portion 411, thereby causing the seal to fold and unfold between the position shown in FIG. 4A and the position shown in FIG. 4B, so that effectively, the skirt inverts and turns itself inside out.

Above the first seal provided by the skirt 408 is a second similar annular seal generally indicated at 438 comprising a second skirt 441 having ribbed edge portions 442, 444. One edge portion 442 is engaged in the undercut annular channel 428, defined between the annular surface 423 and an annular portion 443 of the columnar structure 403, during assembly, and the other edge portion is engaged between an upper flange portion 446 of the sheath 409 and a shouldered annular end portion 448 of a second sheath 450 which is fitted onto the exterior of the sleeve 408 so as to define a channel 452 between the flange portion 446 and the sheath 409. The annular portion 443 provides a guide for the skirt 441, between which and the sheath 409 exists an annular gap similar to that within the collar 412.

The second seal 438 is identical to the first seal 436 and is constrained to be flexed and to move in the same manner and with the same degree of motion as the first seal.

The integral columnar structure 403 of the platform and the sheaths 409 and 450 can slide freely within the confines of the annular body portion 417 of the frame member 413 and are entrained to do so by the mechanism which controls movement of the platform 401 up to and away from the frame member 413 to raise and lower the electrodes rigidly mounted from the floor of the tank chamber.

From the arrangement just described, it can be seen that the two seals ensure that there is completely sealed engagement between the tank chamber and the platform 401 on which it is mounted, between that platform 401 and the frame member 413 mounted under the block 60 and between that frame member 413 and the block 60, thus enabling the reduced pressure, or vacuum, maintained within the accelerator to also be maintained within the tank chamber while permitting movement of the tank chamber, to thereby move the electrodes into and out of the path of an ion beam passing through the accelerator.

Reference was made above to the entrance and exit electrodes 35, 36, 40, 41 of the two stages 10a and 10b and to the fact that these electrodes are moved with the r.f. electrodes 37, 38, 42, 43. To this end, as can be seen from FIG. 5 in particular, the second sheath 450 is of a height (or length measured perpendicular to the axis 31) such that, when it is mounted on the sleeve portion 404 in abutment with the sheath 409, its upper end face is coplanar horizontally with the upper end face of the annular sleeve 404. These coplanar end faces provide a seat for supporting the entrance and exit electrodes 40, 41 (and similarly electrodes 35, 36). Electrodes 40, 41 are shown most clearly in FIG. 5. Each electrode has a seating surface 453 and a leg portion 454 whereby the electrode can be seated on and braced against an inner surface of the annular sleeve 404. The two electrodes 40, 41 are, when the assembly is being assembled, aligned with the r.f. electrodes 42, 43 and then fixed in position by screw fastenings or the like (not shown). As an alternative to screw fastening, the annular sleeve 404 may be formed with rebated slots, each to accommodate a correspondingly shaped portion of the leg portion 454 and thereby retain the respective electrode in situ. Whatever the manner of mounting these entrance and exit electrodes, it is important that they should be as readily demountable as the r.f. electrodes 42, 43 when it becomes necessary to replace them.

From the above description, it can be seen that the platform can be moved vertically as shown in FIG. 6 and that this movement, up or down as the case may be, causes the two skirts 408 and 441 to 'peel' and 'unpeel' as the platform 401 is moved relative to the block 60 and the frame member 413 mounted therebeneath.

The uppermost and lowermost positions of the platform and the associated tank circuits are shown most clearly in FIGS. 2A, 3A, 4A and 2B, 3B, 4B respectively, as viewed in side sectional elevation.

The manner of mounting the tank chamber 47 to permit movement thereof, while maintaining the sealed relationship between the tank circuits and the interior of the assembly has been explained. However, in practice, and as shown in FIGS. 2A, 2B, the tank chambers 47, 48 are mounted in tandem. For each of the two stages, the manner of mounting each tank chamber is the same.

In an alternative embodiment of the present invention, one or both of the skirts 408, 441 may be replaced by a bellows arrangement where upper and lower edge portions of such a bellows are entwined between the frame member 413 and/or the block 60 on the one hand and the movable platform 404 on the other, in sealing engagement therewith to maintain a vacuum within the respective tank chamber 48, 49.

As a further alternative, a seal can be maintained between the block 60/frame member 413 and the platform 404 and respective tank chamber by a telescopic concentric sleeve arrangement in which one sleeve, or a collar, is mounted in sealed engagement on the frame member 413/block 60, and a further sleeve mounted in sealed engagement on the platform 404 can slide in sealed relationship to that mounted on the frame member or block in telescopic fashion, with, if necessary, one or more intermediate concentric telescopic sleeves therebetween, also in sealed engagement with the inner and outer sleeves.

To provide an accelerator having as great a flexibility of use as possible, it is also useful to be able to move one set of electrodes independently of the other.

In FIGS. 7A, 7B, 8A, 8B and 9, there is shown the mechanism for moving one or both tank circuits of the illustrated accelerator, between a first position in which the electrode apertures of one or both stages of the assembly are aligned with the beam path, and a second position in which all of the electrodes are themselves entirely clear of the beam path. In the disclosed embodiment, each set of electrodes is movable independently of the other, though, as will be explained later, with this same arrangement, it is also possible to move both sets of electrodes together.

Four vertically downwardly extending shafts 460 and two spindles 460a are mounted so as to depend from the frame member 413, the shafts 460 being mounted for rotation in bearings (not shown) in the rectangular frame member 413, with one shaft at or adjacent each corner of the frame.

Each shaft 460 and each spindle 460a has mounted thereon a toothed pulley wheel or sprocket wheel 461, and all of the wheels are mounted so that they lie in a common horizontal plane parallel to the axis 31. Hereinafter, these will be referred to for the sake of clarity as wheels though it is to be clearly understood that any suitable form of rotatable element capable of co-operating with an endless drive belt (or chain or the like) is meant by the term wheel, including gear wheels and friction rollers for example. An endless drive belt 462 extends under tension around the six wheels 461 as shown in dotted line in FIG. 9; though not shown, between adjacent wheels, one or more spring-biased idler wheels can be provided to guide the belt and maintain it under correct tension.

One of the four 'corner' shafts, 460b, is coupled by gearing 463 to a reversible drive motor 464 for driving the belt in one direction or the other. Each of the four shafts 460, including the shaft 460b, is externally-threaded along its upper length and extends, in threaded engagement, through a respective internally-threaded insert 465 secured to the underside of the frame member 413. Each shaft passes through a cup 466 which is secured to the underside of the platform 401 from which the tank chamber 47 also depends, and each shaft has a central part 467 of enlarged diameter which is seated within the cup and holds the respective shaft in situ relative to the platform. The four shafts 460, including shaft 460b, are, of course, similarly threaded. By rotating the shaft 460b and thus the shafts 460 via the drive belt transmission 462, the platform 401 can be raised or lowered as required relative to the frame member 413, thereby to move the electrodes, associated coils and tank chamber.

The accelerator assembly illustrated in the Figures comprises two sets of electrodes and thus associated coils and tank chambers. It is quite feasible that both units (i.e. electrodes, coils, tank chambers) can be driven together from a single drive motor with a single transmission drive belt extending around and in engagement with all of the wheels 461. However, to provide greater flexibility of operation, it may be required to raise/lower only one set of electrodes at a time and, for this purpose, separate drives are provides for the two units.

It is then very simple to combine and co-ordinate the operation of the drives simply by controlling the power supply to the two motors.

As described herein, each set of electrodes is moved into alignment with the beam path or clear of the beam path by rotation of the threaded shafts 460 and consequent vertical movement of the platform up or down those shafts according to the direction of rotation thereof.

As an alternative to such an arrangement, a further embodiment of the invention employs fixed externally-threaded shafts and internally-threaded sprockets or toothed pulley wheels which can be driven from a drive sprocket or pulley wheel which is coupled to the output shaft of a drive motor so that rotation thereof causes rotation of the threaded sprockets or pulley wheels to move them up or down the fixed threaded shafts as required. As with the above illustrated embodiment, the sprockets/pulley wheels and drive sprocket would all be mounted on a moveable frame, platform or housing which supported the tank circuit and thus the electrodes. With such an arrangement, it would be possible to mount the threaded shafts directly on the accelerator block instead of in a frame member below the block.

As further alternatives, movement of the tank circuit and thus of the electrodes may also be effected by hydraulic or pneumatic arrangements, whereby a plurality of pistons or cylinders are mounted to raise and lower the tank circuit relative to the beam path with the pistons or the cylinders coupled to the tank circuit, and the co-operating member fixed relative to the beam path.

As a still further alternative manner of effecting movement of the electrodes into alignment with and clear of the beam path, and in contrast to the above-described solutions, the electrodes may be pivotally moved out of alignment with the beam path, although such pivotal movement would normally only be considered where the structural relationship and disposition of the electrodes and remaining elements of the tank circuit or its equivalent could be sustained.

Figure 10:
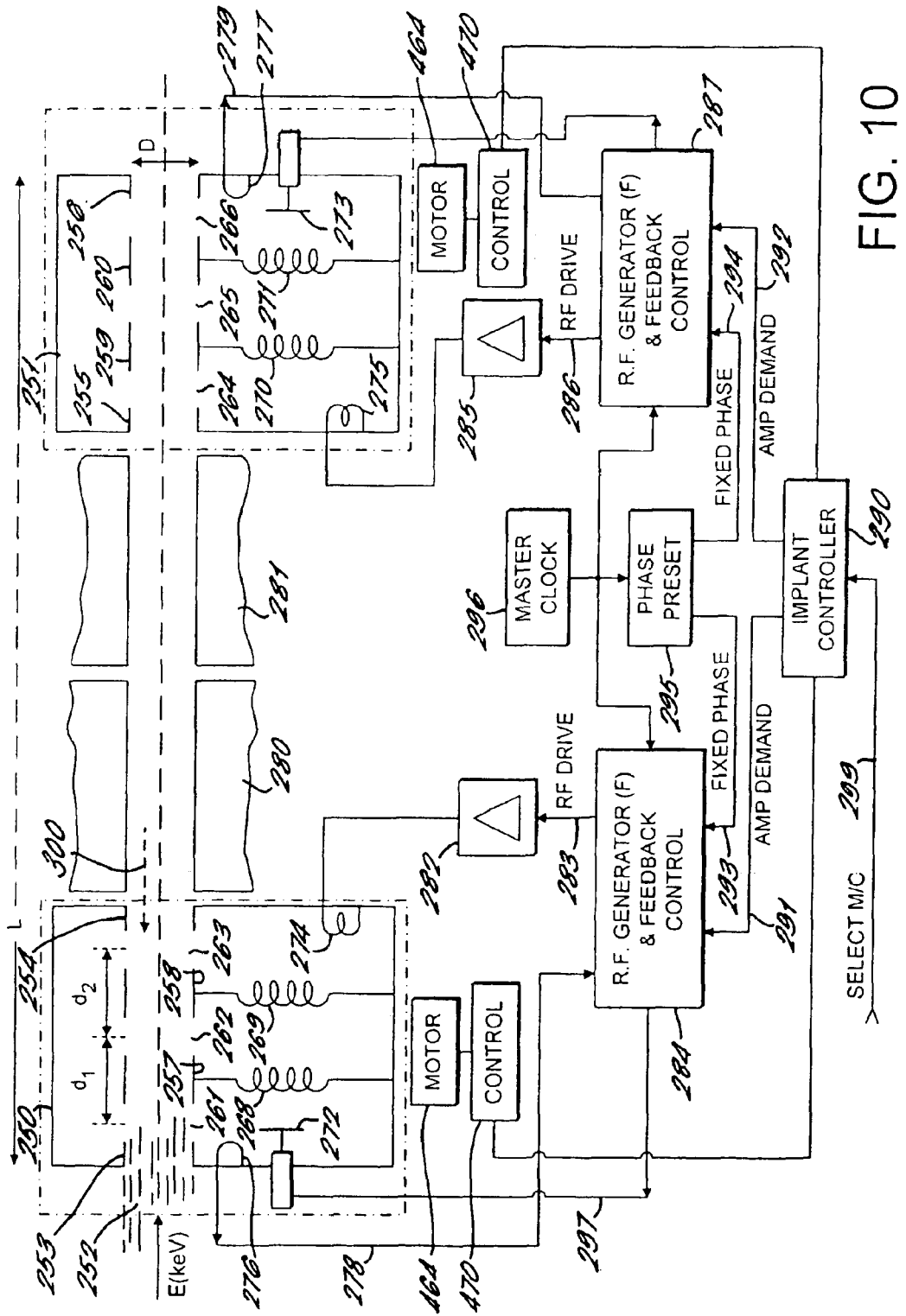
FIG. 10 is a schematic circuit diagram of an r.f. accelerator assembly embodying and illustrating various features of the present invention.

In FIG. 10, there is shown a schematic circuit diagram of an r.f. accelerator assembly according to the invention. this circuit, except for the following description, is fully described in U.S. Pat. No. 6,423,976 which is incorporated herein by reference and will not therefore be further described herein.

The implant process as a whole is controlled by a micro processor based implant controller 290. The implant controller may control a number of operating parameters of the implanter but for the purposes of illustrating the present invention, the controller 290 is shown as connected to control circuits 470 which control the operation of the motors 464 to raise and lower the platforms 401. As can be readily appreciated from the foregoing description, the control circuits can be operated from the implant controller 290 independently of each other or simultaneously so that one or other or both of the platforms can be moved.

In the preferred embodiment, the r.f. accelerator assembly as illustrated has dimensions which are similar to those of the assembly disclosed in the aforementioned U.S. Pat. No. 6,423,976.

What is claimed is:

1. An ion implanter comprising an ion beam generator for generating a beam of ions to be implanted in which said ions are at a first energy, and an accelerator assembly having a vacuum chamber and operative when energised to accelerate ions of said beam to a second energy along a beam path through the vacuum chamber of the assembly, the assembly comprising at least one electrode mounted in the vacuum chamber to be movable between a respective operational position for generating an accelerating electric field to accelerate said ions along said beam path, and a respective non-operational position within the vacuum chamber displaced clear of said beam path, and an actuator to move said electrode between said operational and non-operational positions.

2. An ion implanter according to claim 1, wherein said accelerator assembly is a radio frequency (r.f.) accelerator.

3. An ion implanter according to claim 2, wherein said r.f. accelerator is a linear accelerator.

4. An ion implanter according to claim 3, wherein the accelerator assembly comprises at least one r.f. booster stage comprising entrance and exit electrodes and at least one intermediate r.f. electrode.

5. An ion implanter according to claim 4, wherein said electrodes of said booster stage are mounted to be movable together transversely of said beam path between respective said operational and non-operational positions.

6. An ion implanter according to claim 5, wherein the accelerator assembly comprises at least first and second said r.f. booster stages in tandem along said beam path, said first booster stage being upstream of said second booster stage relative to said beam direction, and said electrodes of second booster stage being movable between respective said operational and non-operational positions independently of said electrodes of said first booster stage.

7. An ion implanter according to claim 4, wherein said at least one r.f. electrode is movable between said operational and non-operational positions, and the accelerator assembly includes at least one inductive coil electrically connected to said at least one intermediate r.f. electrode, and an electrically conductive enclosure around said coil;

said coil, said at least one electrode and said conductive enclosure forming together a r.f. tank circuit having a predetermined resonant frequency when the at least one r.f. electrode is in said operational position; said coil being mounted to move with said at least one r.f. electrode.

8. An ion implanter according to claim 7, wherein said conductive enclosure is mounted to be movable with said coil and said at least one r.f. electrode.

9. An ion implanter according to claim 1 wherein said accelerator assembly comprises a housing defining said vacuum chamber, a platform supporting said at least one electrode, a frame member rigidly secured to the housing, and a mechanism coupling the platform to the frame member to permit the platform to be moved by the actuator.

10. An ion implanter according to claim 9, wherein said coupling mechanism is arranged to permit the platform to be moved linearly transverse to the beam path.

11. An ion implanter according to claim 10 wherein the mechanism comprises a plurality of spaced parallel threaded shafts rigidly and rotatably mounted on one of the platform and the frame member and threaded bearings mounted on the other for movement along the shafts when the shafts are rotated, and a drive coupling the rotatable shafts for rotating the shafts simultaneously to effect movement of the bearings along the shafts.

12. An ion implanter according to claim 11 wherein each shaft has a belt wheel mounted thereon for rotation with the respective shaft, and the assembly includes a drive belt engaging the belt wheels of the shafts to couple the shafts together, and a motor coupled to one of the shafts for rotating the shafts simultaneously.

13. An ion implanter according to claim 10 wherein the mechanism comprises a plurality of spaced parallel pistons rigidly mounted on one of the platform and the frame member and a plurality of cylinders mounted on the other and a pump for varying fluid pressure within the cylinders to move the pistons thereby to move the frame member and the platform relative to the other.

14. An ion implanter according to claim 9, wherein the platform is adapted for mounting beneath the housing of the accelerator.

15. An ion implanter according to claim 9 wherein a flexible seal is provided between the vacuum chamber and the conductive enclosure to permit movement of the conductive enclosure relative to the vacuum chamber.

16. An ion implanter according to claim 15 wherein the flexible seal is provided between the frame member and the platform.

17. An ion implanter according to claim 16 wherein the flexible seal is in the form of an annular skirt which is held at one end in sealed engagement with the frame member and encircles an aperture in the frame member through which said at least one electrode of the assembly can be moved between said operational and non-operational positions, and is held in sealed engagement at its opposite end with the platform, whereby to permit the conductive enclosure to be maintained at the same pressure as the vacuum chamber.

18. An ion implanter according to claim 17 wherein the annular skirt is entrained at said one end so as to be in sealed engagement with said frame member by an annular sleeve mounted on one of the housing and the frame member in concentric relationship to a further sleeve which entrains the opposite end of the skirt, and is secured to the conductive enclosure, one sleeve being movable relative to the other to permit movement of said at least one electrode between said operational and non-operational positions.

19. An ion implanter according to claim 18 wherein a flexible seal in the form of an annular bellows is provided between the conductive enclosure and the vacuum chamber.

20. An accelerator assembly, for an ion implanter of the kind comprising an ion beam generator for generating a beam of ions to be implanted in which said ions are at a first energy, said accelerator assembly comprising a vacuum chamber and being suitable when in use and energised for accelerating ions of said beam to a second energy along a beam path, through the vacuum closure of the assembly, the assembly further comprising at least one electrode mounted in the vacuum chamber to be movable between a respective operational position for generating an accelerating electric field to accelerate said ions along said beam path, and a respective non-operational position within the vacuum chamber displaced clear of said beam path, and an actuator to move said electrode between said operational and non-operational positions.

21. A method of ion implantation comprising the steps of providing an accelerator assembly having a vacuum chamber containing at least one accelerating electrode, the assembly being operative when energised to accelerate ions travelling along a beam path through the vacuum chamber of the assembly from a first energy on entering the assembly to second energy when leaving the assembly, moving said at least one accelerating electrode from a respective operational position in which, when energised, accelerating electric fields can be generated for accelerating said ions along said beam path, to a respective non-operational position within the vacuum chamber displaced clear of said beam path, generating at a desired energy a beam of ions to be implanted, directing said beam along said beam path through the vacuum chamber of the accelerator assembly without energising said assembly so that said beam leaves said accelerator assembly at said desired energy, and further directing ions of said beam leaving said assembly at a substrate for implantation thereon.

* * * * *